United States Patent
Kanasaki et al.

(10) Patent No.: US 7,292,122 B2
(45) Date of Patent: Nov. 6, 2007

(54) SURFACE ACOUSTIC WAVE FILTER AND WIRELESS DEVICE THAT EMPLOYS THE SAME

(75) Inventors: Hiroshi Kanasaki, Otawara (JP); Osamu Kawachi, Yokohama (JP)

(73) Assignee: Fujitsu Media Devices Limited, Yokohama (JP)

( * ) Notice: Subject to any disclaimer, the term of this patent is extended or adjusted under 35 U.S.C. 154(b) by 180 days.

(21) Appl. No.: 10/992,116

(22) Filed: Nov. 19, 2004

(65) Prior Publication Data

US 2005/0110599 A1 May 26, 2005

(30) Foreign Application Priority Data

Nov. 21, 2003 (JP) .............................. 2003-392832

(51) Int. Cl.
*H03H 9/64* (2006.01)
(52) U.S. Cl. .................. 333/193; 333/195; 310/313 B
(58) Field of Classification Search ........ 333/193–196; 310/313 B, 313 D
See application file for complete search history.

(56) References Cited

U.S. PATENT DOCUMENTS

| | | | |
|---|---|---|---|
| 6,556,100 B2 * | 4/2003 | Takamine | .................. 333/133 |
| 6,759,928 B2 * | 7/2004 | Endou et al. | ................ 333/193 |
| 2002/0121842 A1 * | 9/2002 | Takamine | ................ 310/313 B |
| 2004/0251776 A1 * | 12/2004 | Shibahara et al. | ...... 310/313 D |

FOREIGN PATENT DOCUMENTS

| | | | | |
|---|---|---|---|---|
| JP | 60-55715 | * | 4/1985 | .................. 333/195 |
| JP | 2-104013 | * | 4/1990 | .................. 333/193 |
| JP | 6-204781 | | 7/1994 | |
| JP | 11-97966 | | 4/1999 | |
| JP | 2000-31777 A | | 1/2000 | |
| JP | 2003-209456 | * | 7/2003 | |

* cited by examiner

*Primary Examiner*—Barbara Summons
(74) *Attorney, Agent, or Firm*—Arent Fox LLP

(57) ABSTRACT

A surface acoustic wave (SAW) filter includes a piezoelectric substrate, a first interdigital transducer (IDT) for input and a second IDT for output that are provided on the piezoelectric substrate, the first IDT and the second IDT being arranged in a propagation direction, and a shield electrode arranged between the first IDT and the second IDT and/or between interconnection lines that connect the first IDT and the second IDT, at least one of the first IDT and the second IDT being of a longitudinal coupling multi-mode type having a balanced operation. Thus, it is possible to suppress a stray capacitance between the first IDT and the second IDT, and thereby to improve the symmetry of balanced operation signals.

5 Claims, 20 Drawing Sheets

SURFACE ACOUSTIC WAVE FILTER AND WIRELESS DEVICE THAT EMPLOYS THE SAME

BACKGROUND OF THE INVENTION

1. Field of the Invention

This invention generally relates to a surface acoustic wave (hereinafter referred to as SAW) device that employs a piezoelectric material, and more particularly, to a SAW device having multiple interdigital transducers (hereinafter referred to as IDT) that are provided on a piezoelectric substrate, and to wireless devices that employ the same. This SAW device is of a longitudinal coupling multi-mode type.

2. Description of the Related Art

The SAW filters are widely used for high-frequency circuits on wireless devices as filters. The wireless devices are represented by mobile telephones or the like. In recent years, integrated circuits (ICs) that perform a balanced input and output operation have been employed for the high-frequency circuits of the wireless devices. Subsequently, the SAW filter is also required to perform the balanced input and output operation. Conventionally, as an example of realizing the balanced operation, Japanese Patent Application Publication No. 6-204781 (hereinafter referred to as Document 1) discloses a method of using electrodes as input and output terminals. One electrode that faces the IDT on the input side is used for an input terminal, and the other electrode that faces the IDT on the output side is used for an output terminal. Also, as another example, Japanese Patent Application Publication No. 11-97966 (hereinafter referred to as Document 2) discloses that the IDTs are divided into two groups, that is, input group and output group. The balanced operation is realized by operating those two groups that are 180° out of phase.

It is to be noted that there are problems in the conventional techniques disclosed in Documents 1 and 2. Specifically, a stray capacitance is generated between the IDT on the input side and that on the output side, and the symmetry is bad between balanced operation signals. Thus, electronic devices equipped with the SAW filters such as wireless devices may malfunction.

SUMMARY OF THE INVENTION

It is a general object of the present invention to solve the above-mentioned problems.

More specifically, the present invention intends to reduce the stray capacitance between the input-side IDT and the output-side IDT and improve the symmetry between the balanced signals.

This is achieved by suppressing the stray capacitance between the IDT on the input side and that on the output side to a small degree and improving the symmetry between the balanced operation signals.

According to an aspect of the present invention, there is provided a surface acoustic wave (SAW) filter includes, a piezoelectric substrate, a first interdigital transducer (IDT) for input and a second IDT for output that are provided on the piezoelectric substrate, the first IDT and the second IDT being arranged in a propagation direction, and a shield electrode arranged between the first IDT and the second IDT and/or between interconnection lines that connect the first IDT and the second IDT, at least one of the first IDT and the second IDT being of a longitudinal coupling multi-mode type having a balanced operation.

BRIEF DESCRIPTION OF THE DRAWINGS

Preferred embodiments of the present invention will be described in detail with reference to the following drawings, wherein.

DESCRIPTION OF THE PREFERRED EMBODIMENTS

A description will now be given, with reference to the accompanying drawings, of embodiments of the present invention.

First Embodiment

Figure 1:
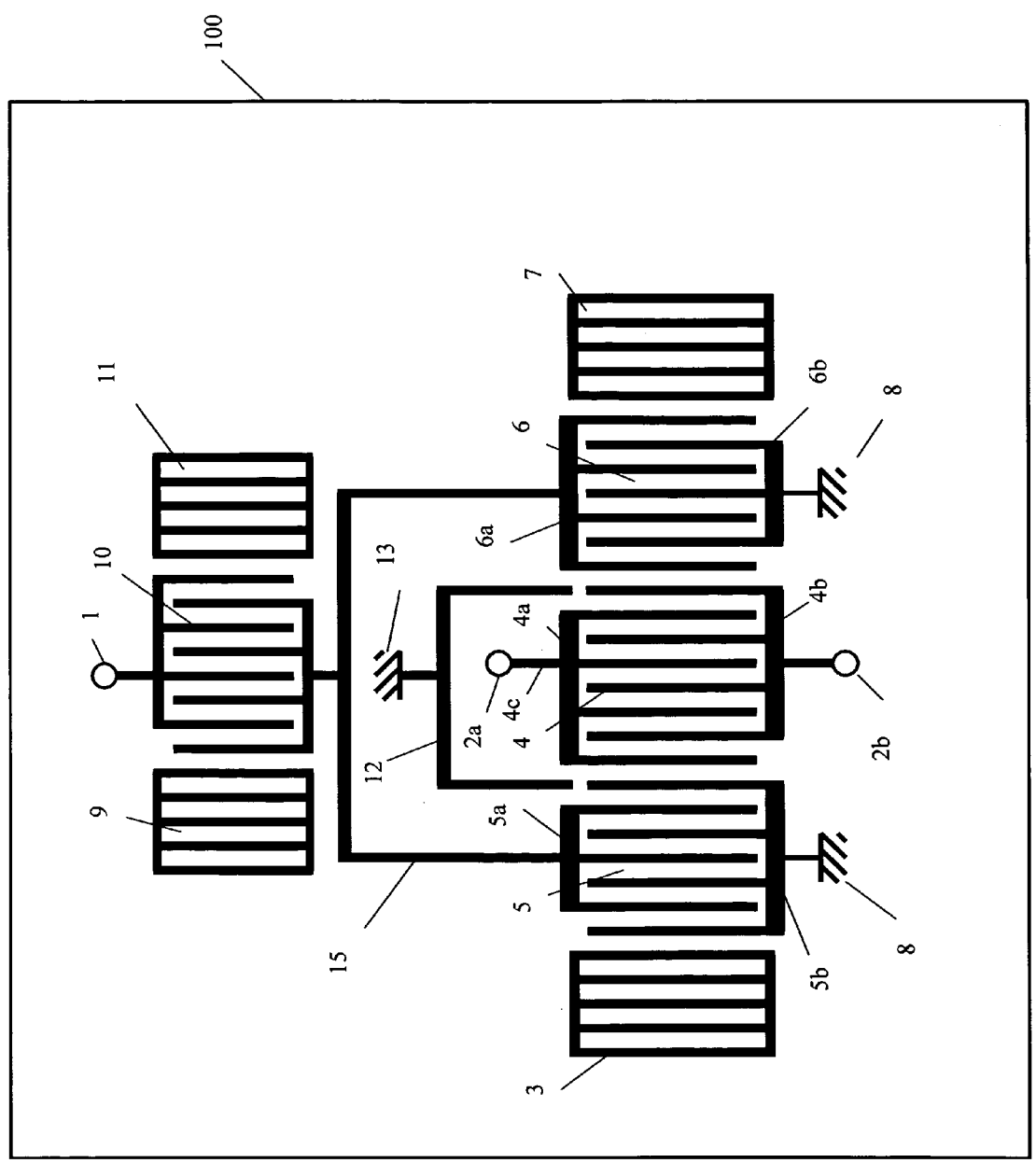
FIG. 1 is a plan view of a SAW filter in accordance with a first embodiment of the present invention.

FIG. 1 is a plan view of a SAW filter of a longitudinal coupling multi-mode type in accordance with a first embodiment of the present invention. The SAW filter has a unique shield electrode 12, which will be described after basic components of the first embodiment.

This SAW filter includes a piezoelectric substrate 100 and three IDTs 4, 5, and 6. The piezoelectric substrate 100 is made of lithium tantalate or lithium niobate. The three IDTs 4, 5, and 6 are adjacently arranged in a propagation direction on the piezoelectric substrate 100. The IDTs 4, 5, and 6 are schematically illustrated in FIG. 1. In fact, the IDT 4 is arranged at the center, and the IDTs 5 and 6 are arranged on both sides of the IDT 4. Each of the IDTs 4, 5, and 6 is composed of a pair of comb-like electrodes. Each comb-like electrode is composed of a bus bar and electrode fingers that extend from the bus bar. The bus bar serves as an interconnection line that connects the electrode fingers together. For instance, the pair of comb-like electrodes of the IDT 4 includes bus bars 4a and 4b and the electrode fingers that extend from the bus bars 4a and 4b. The electrode fingers extending from the bus bar 4a and those extending from the bus bar 4b are alternately overlapped or interleaved, and overlapping parts of the adjacent electrode fingers are involved in excitation of the SAW. Similarly, a pair of comb-like electrodes of the IDT 5 includes bus bars 5a and 5b and the electrode fingers that extend from the bus bars 5a and 5b. A pair of comb-like electrodes of the IDT 6 includes bus bars 6a and 6b and the electrode fingers that extend from the bus bars 6a and 6b. The bus bar 5a of the IDT 5 and the bus bar 6a of the IDT 6 are connected to a signal line 15, and the bus bar 5b of the IDT 5 and the bus bar 6b of the IDT 6 are connected to a ground 8. On the other hand, the bus bars 4a and 4b of the IDT 4 are connected to balanced signal terminals 2a and 2b respectively. Signals that appear on the balanced signal terminals 2a and 2b are balanced signals, that is, the signals having the 180° phase difference. Along the propagation direction of the SAW, a reflector 3 is arranged adjacent to the IDT 5, and a reflector 7 is arranged adjacent to the IDT 6.

In addition, there are provided an IDT 10 and reflectors 9 and 11 that are arranged on both sides of the IDT 10. The IDT 10 is composed of a pair of comb-like electrodes. One of the comb-like electrodes is connected to a signal terminal 1, and the other is connected to a signal line 15. The signal line 15 connects the IDT 10, the IDT 5, and the IDT 6. For example, the signal terminal 1 serves as an input terminal. The balanced signal terminals 2a and 2b serve as output terminals. In contrast, the signal terminal 1 may serve as an output terminal. The balanced signal terminals 2a and 2b may serve as input terminals.

Next, a description will be given of the shield electrode 12. The shield electrode 12 is arranged between the bus bar 4a, the balanced signal terminal 2a, a signal line 4c and the signal line 15. Both edges of the shield electrode 12 are respectively arranged between the bus bar 4a and the bus bar 5a, and between the bus bar 4a and the bus bar 6a. The shield electrode 12 is also connected to the earth potential 13. In the case where the signal terminal 1 serves as the input terminal, the shield electrode 12 is arranged between the input IDTs 5 and 6 and the output IDT 4, and between the signal lines 4c and 15. The signal line 4c is connected to the IDT 4, and the signal line 15 is connected to the IDTs 5 and 6. The shield electrode 12 operates in order to reduce affects on the stray capacitance between input and output.

Figure 2:
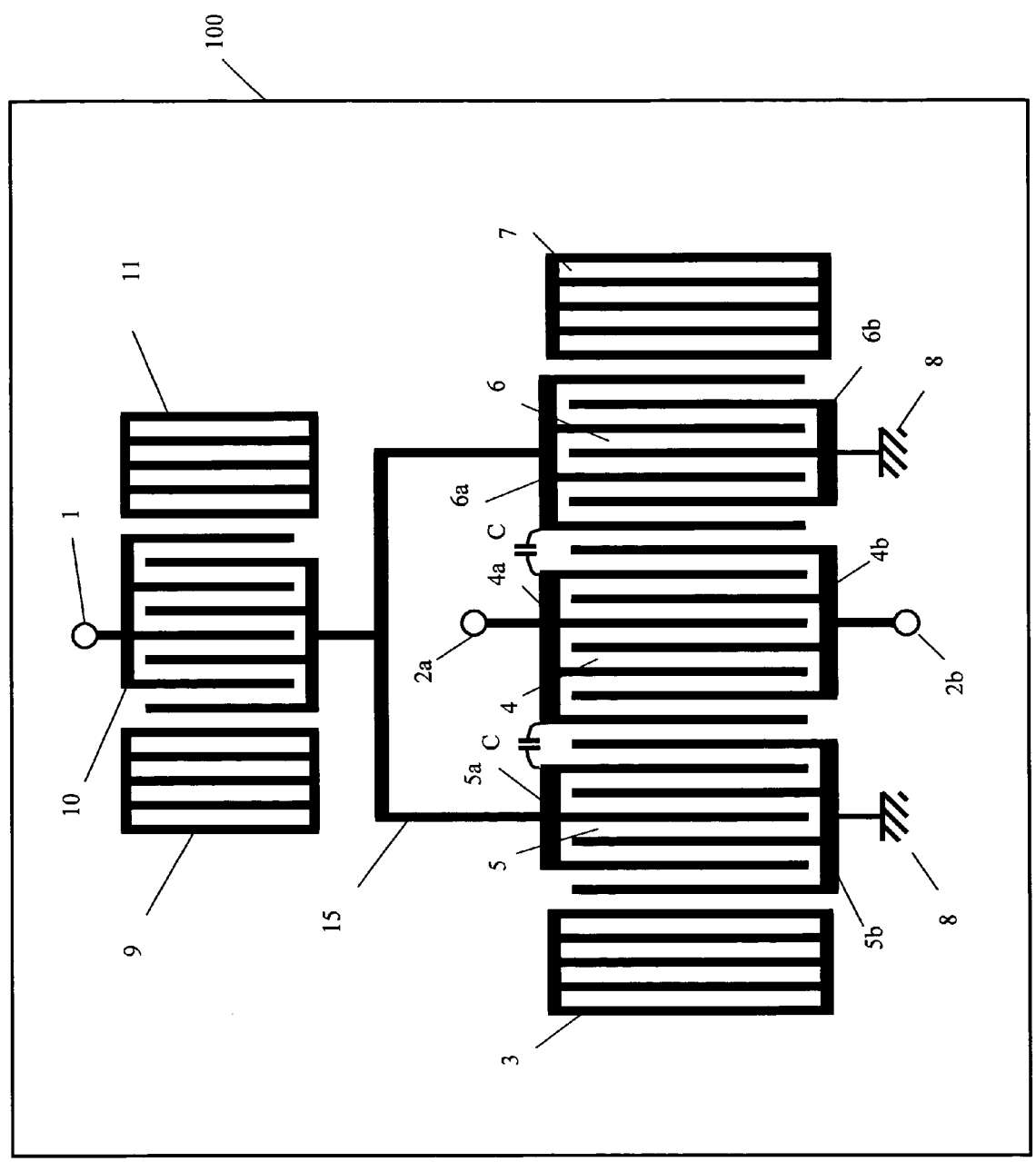
FIG. 2 shows an example of a stray capacitance.

FIG. 2 shows an example of the stray capacitance. FIG. 2 shows a configuration obtained by omitting the shield electrode 12 and the earth potential 13 from FIG. 1. Hereinafter, this configuration is referred to as a comparative example. Referring to FIG. 2, a stray capacitance C appears between the adjacent bus bars 4a and 5a, and between the adjacent bus bars 4a and 6a. When an input voltage is applied to the signal terminal 1, the input voltage passes through the signal line 15 and excites the IDTs 5 and 6. At the same time, part of the current, which is leaked current, flows through the stray capacitance C to the bus bar 4a from the bus bars 5a and 6a. This current degrades the symmetry of the balanced operation on the balanced signal terminals 2a and 2b. In addition to the above-mentioned stray capacitance, there exist other stray capacitances. For example, there exist small stray capacitances, as compared to the above-mentioned stray capacitance, between the signal line 15 and the bus bar 4a, between the signal line 15 and the signal line 4c, and between the signal line 15 and the balanced signal terminal 2a. Further, a stray capacitance also appears between the electrode fingers extending from the bus bar 5a and between those extending from the bus bar 6a, although they are relatively small.

The shield electrode 12 functions to reduce the affects caused by the above-mentioned stray capacitance C and the other stray capacitances that appear between the signal line 15 and the bus bar 4a, between the signal line 15 and the signal line 4c, and between the signal line 15 and the balanced signal terminal 2a. For example, the current leaked from the bus bars 5a and 6a flows to the edges of the shield electrode 12, which are respectively provided between the bus bars 4a and 5a, and between the bus bars 4a and 6a, and then flows out of the earth potential 13 through the shield electrode 12. Therefore, the above-mentioned current leaked from the bus bars 5a and 6a does not flow into the bus bar 4a of the IDT 4. It is thus possible to improve the symmetry of the balanced operation on the balanced signal terminals 2a and 2b. Similarly, other leaked currents flow into the shield electrode 12, which currents may be the current leaked between the signal line 15 and the bus bar 4a, between the signal line 15 and the signal line 4c, and between the signal line 15 and the balanced signal terminal 2a.

Figure 3:
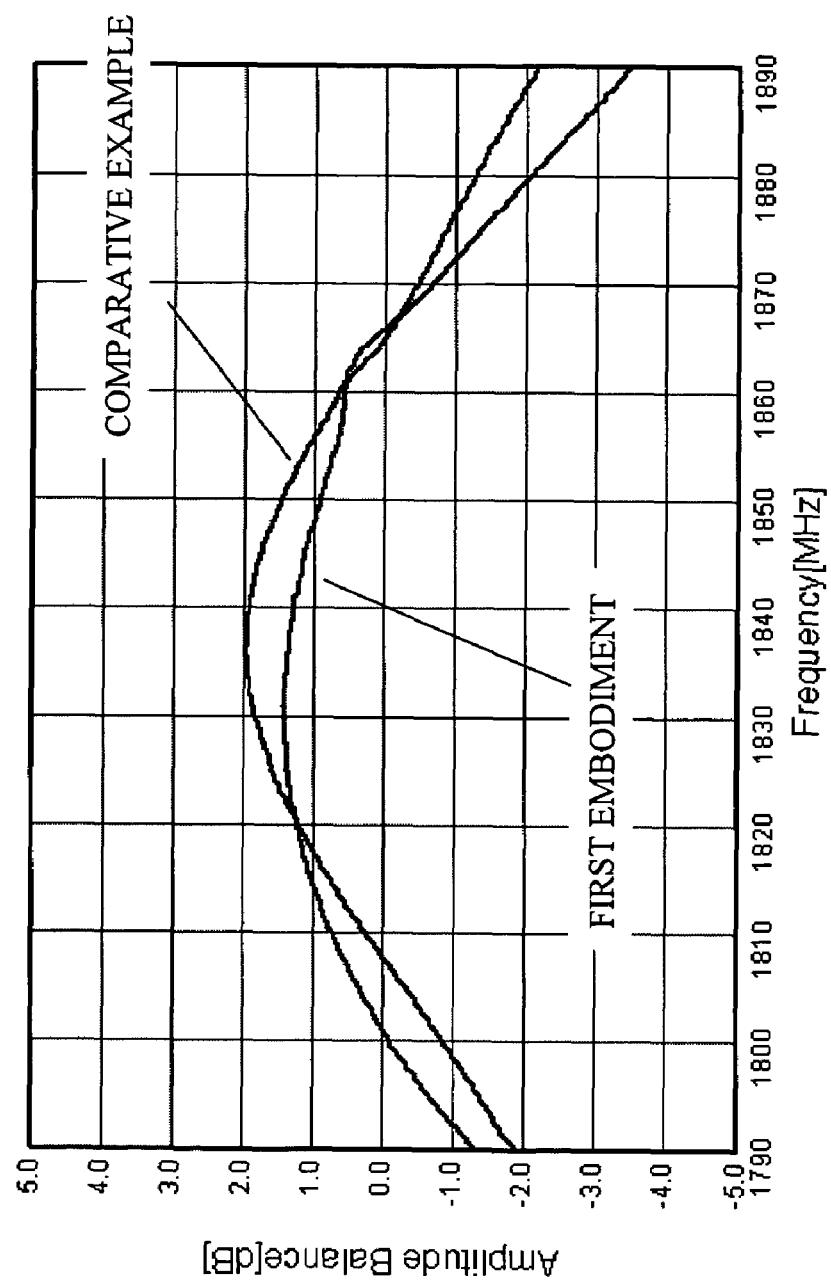
FIG. 3 is a graph showing an amplitude symmetry of the first embodiment of the present invention and a comparative example.
Figure 4:
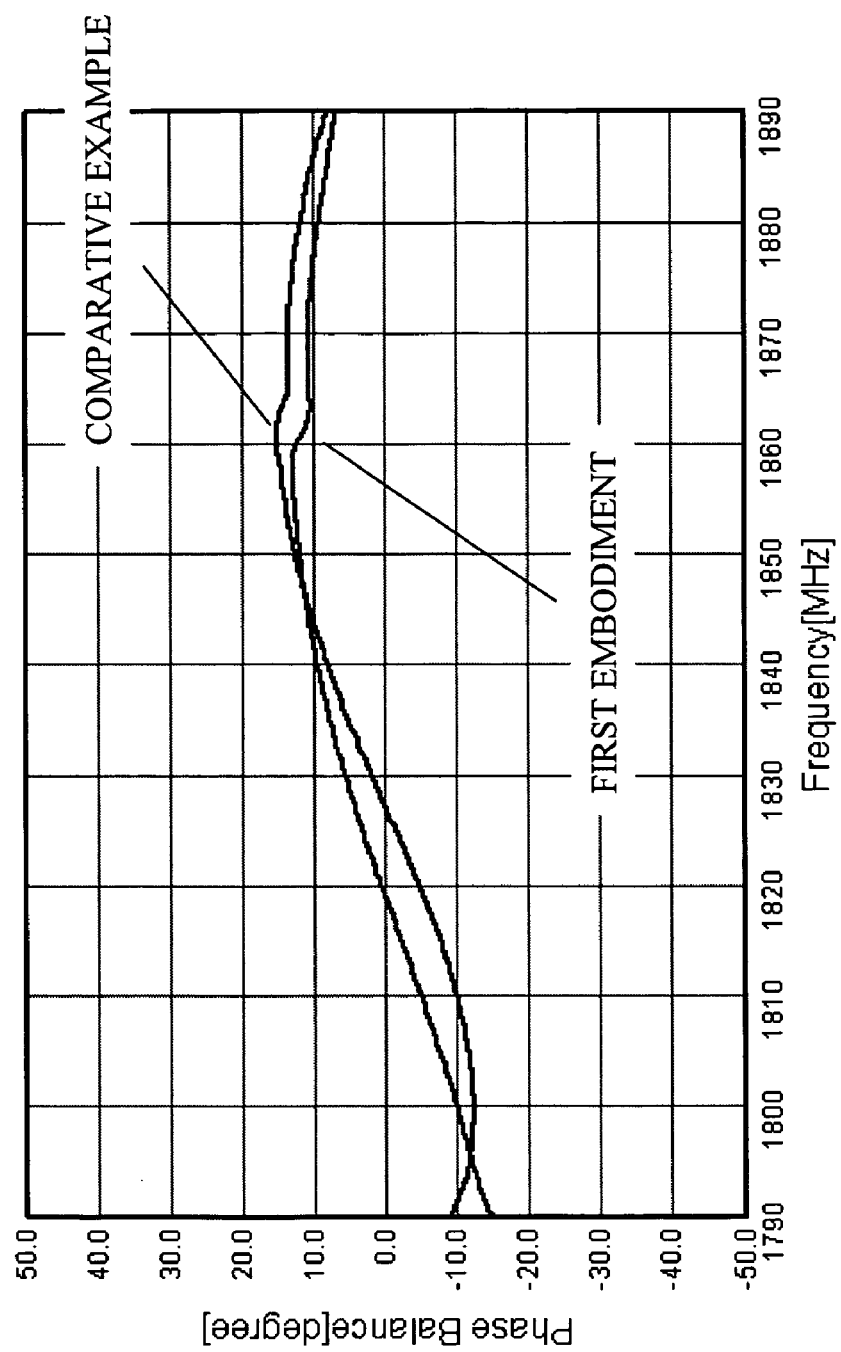
FIG. 4 is a graph showing a phase symmetry of the first embodiment of the present invention and the comparative example.

Referring to FIGS. 3 and 4, a description will be given that the balanced operation in accordance with the first embodiment of the present invention has a more excellent symmetry than the comparative example. The symmetry of the balanced operation may be judged whether is good or bad by examining the symmetries of amplitude and phase. FIG. 3 is a graph showing the amplitude symmetries of the balanced output in accordance with the first embodiment of the present invention and the comparative example. FIG. 4 is a graph showing phase symmetries in accordance with the first embodiment of the present invention and the comparative example. The horizontal axes in FIGS. 3 and 4 denote frequency (MHz). The vertical axis in FIG. 3 denotes frequency symmetry (dB) and the vertical axis in FIG. 4 denotes phase symmetry (degree). On each axis, 0.0 defines the perfect symmetry. As shown in FIGS. 3 and 4, it has been found that both the frequency symmetry and phase symmetry are considerably improved.

Figure 5:
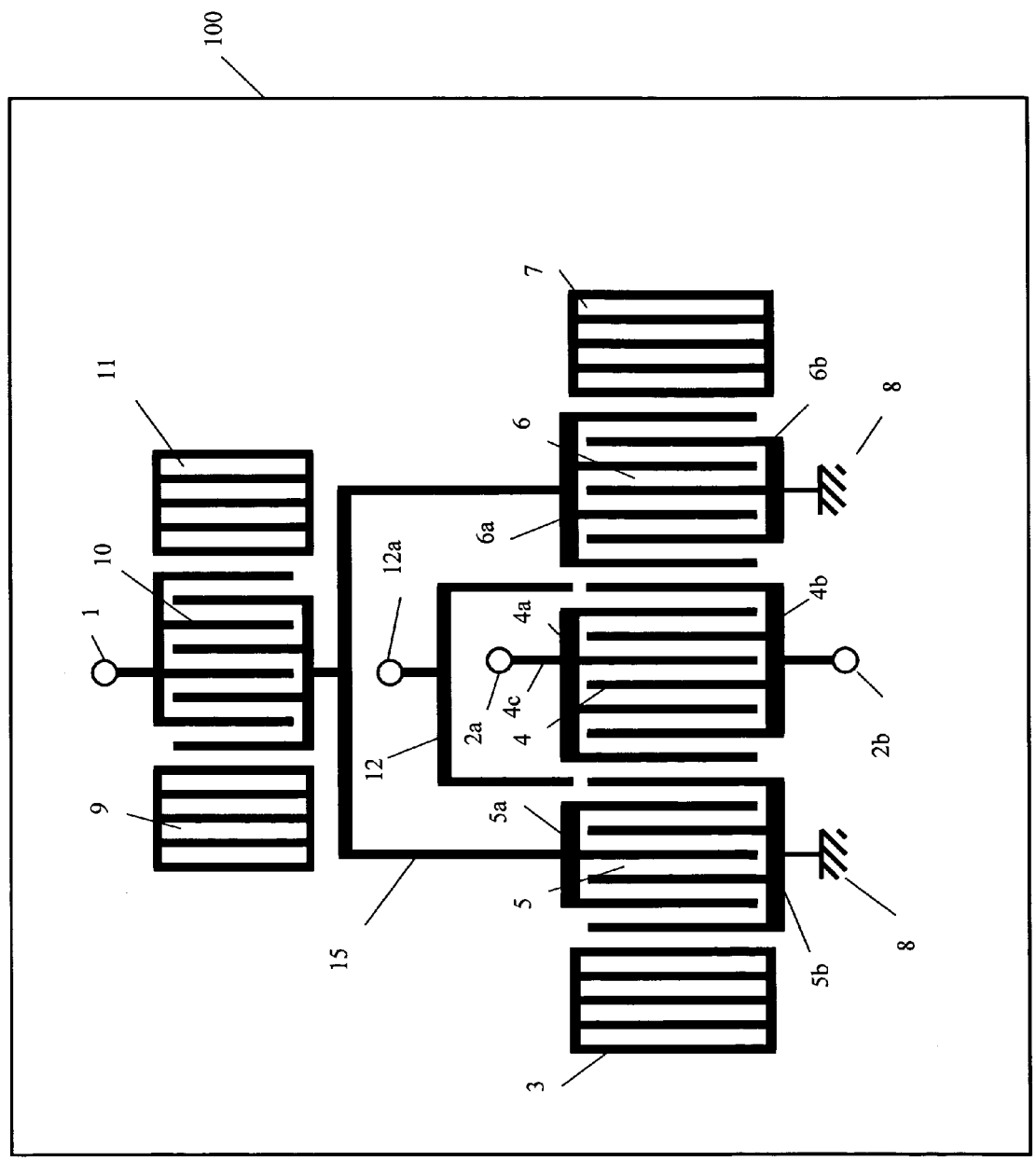
FIG. 5 is a plan view of the SAW filter having a pad for earth potential provided on a piezoelectric substrate in accordance with the first embodiment of the present invention.

The shield electrode 12 is connected to the earth potential 13. The earth potential 13 is not connected to the ground potential 8 to which the IDTs 5 and 6 are connected. That is, the potential connected to the shield electrode 12, which is the earth potential, is in a circuitry different from the circuitry in which the ground potential of the IDTs 5 and 6 is included. In other words, there exists no interconnection line to connect the shield electrode 12 and the IDT 4, or to connect the shield electrode 12 and the IDTs 5 and 6. With the above-mentioned configuration, the shield electrode 12 and the IDTs 5 and 6 are completely separate, and thus it is possible to further improve the symmetry of the balanced operation. The ground potential 8 and the earth potential 13 are fed from outside the SAW filter. For example, the ground potential 8 is fed through an external connection terminal that is attached to a package on which the piezoelectric substrate 100 is mounted, and the earth potential 13 is fed through another external connection terminal. A bonding wire, for example, is used to connect the external connection terminal and the shield electrode 12. In the above-mentioned case, as shown in FIG. 5, preferably, a pad 12a to be connected to the shield electrode 12 is arranged on the piezoelectric substrate 100. Also, referring to FIG. 6, the shield electrode 12 is separated into two parts 12A and 12B to provide pads 12a and 12b respectively. It is preferable that the earth potential 13 may be zero voltage, but may not necessarily be limited to zero voltage.

As shown in FIG. 1, preferably, the edges of the shield electrode 12 are arranged between the adjacent bus bars 4a and 5a, and between the adjacent bus bars 4a and 6a. It is to be noted that the symmetry of the balanced operation can be improved by simply arranging the edges of the shield electrode 12 between the signal line 4c or the balanced terminal 2a and the signal line 15.

In addition, the IDT 10 and the reflectors 9 and 11 may be omitted. Here, the signal line 15 is directly connected to the signal terminal 1.

Second Embodiment

Figure 7:
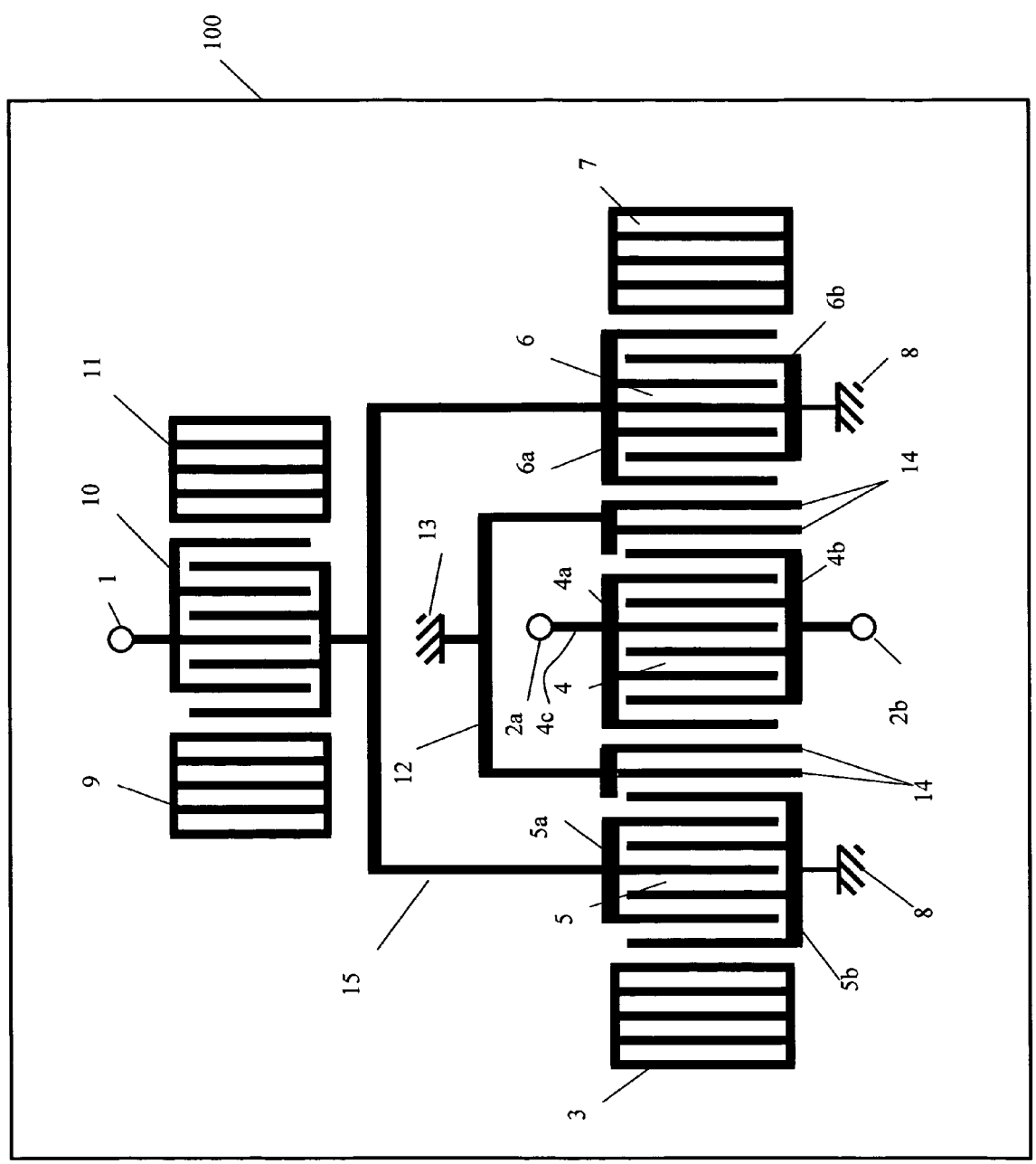
FIG. 7 is a plan view of a SAW filter in accordance with a second embodiment of the present invention.

FIG. 7 is a plan view showing a SAW filter in accordance with a second embodiment of the present invention. Hereinafter, in the second embodiment, the same components and configurations as those of the first embodiment have the same reference numerals. The shield electrode 12 includes two comb-like shield electrodes 14 that are connected to the earth potential 13. One of the two comb-like shield electrodes 14 is arranged between IDTs 4 and 5, and the other is arranged between IDTs 4 and 6. The lengths of electrode fingers of the comb-like electrodes 14 are substantially equal to those of the IDTs 4 though 6, which are vertical to the propagation direction of the SAW. The IDT 4 and the IDT 5 do not face each other. The IDT 4 and the IDT 6 do not face each other, either. The comb-like shield electrode 14 includes two electrode fingers. However, the number of electrode fingers may be one, or may be equal to or greater than three. The comb-like shield electrode 14 may be longer than that shown in FIG. 7.

Figure 8:
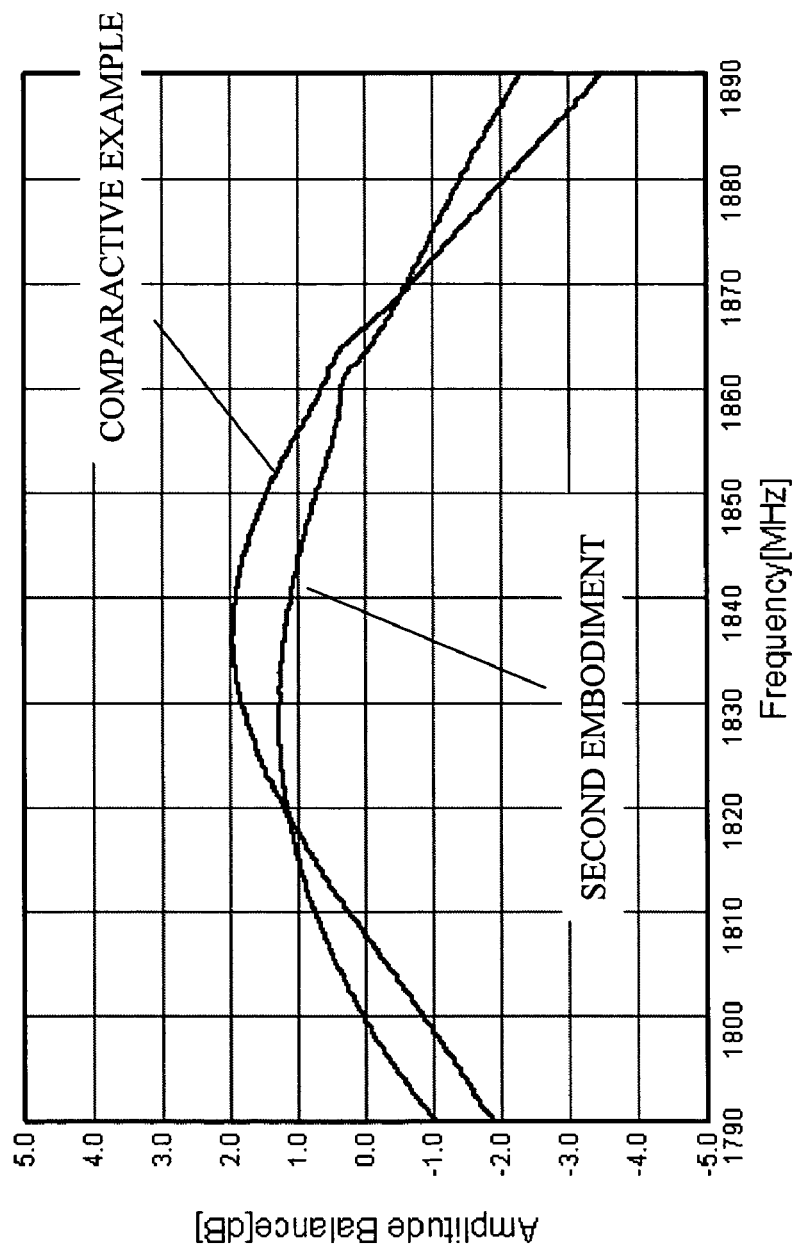
FIG. 8 is a graph showing the amplitude symmetry of the second embodiment of the present invention and the comparative example.
Figure 9:
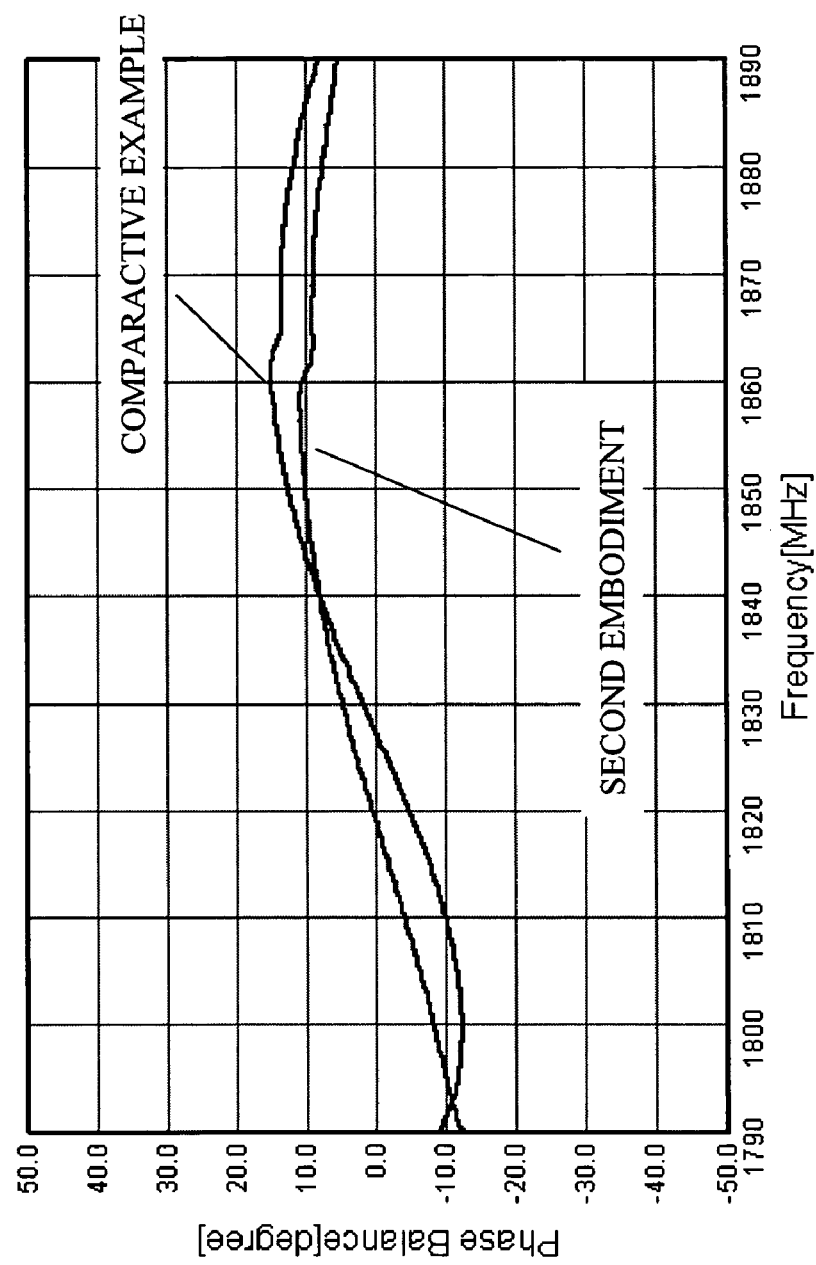
FIG. 9 is a graph showing the phase symmetry of the second embodiment of the present invention and the comparative example.

FIG. 8 is a graph showing the amplitude symmetry of the second embodiment of the present invention and the comparative example in FIG. 2. FIG. 9 is a graph showing the phase symmetry of the second embodiment of the present invention and the comparative example. The horizontal axes in FIGS. 8 and 9 denote frequency (MHz). The vertical axis in FIG. 8 denotes frequency symmetry (dB) and the vertical axis in FIG. 9 denotes phase symmetry (degree). In each vertical axis, 0.0 defines the perfect symmetry. As shown in FIGS. 8 and 9, it has been found that both the frequency symmetry and phase symmetry are considerably improved.

Figure 6:
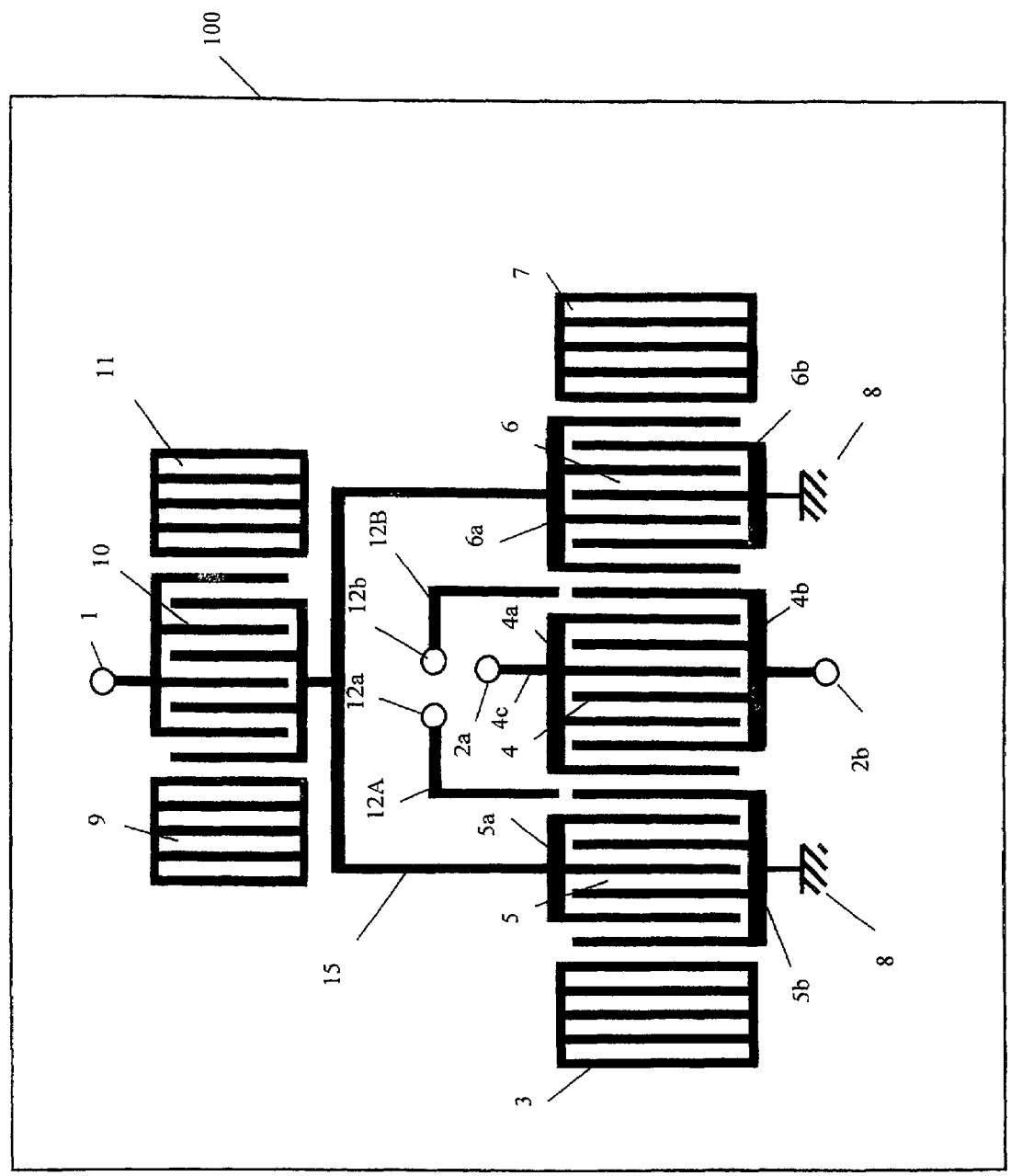
FIG. 6 is a plan view of the SAW filter having another pad for earth potential provided on the piezoelectric substrate in accordance with the first embodiment of the present invention.
Figure 10:
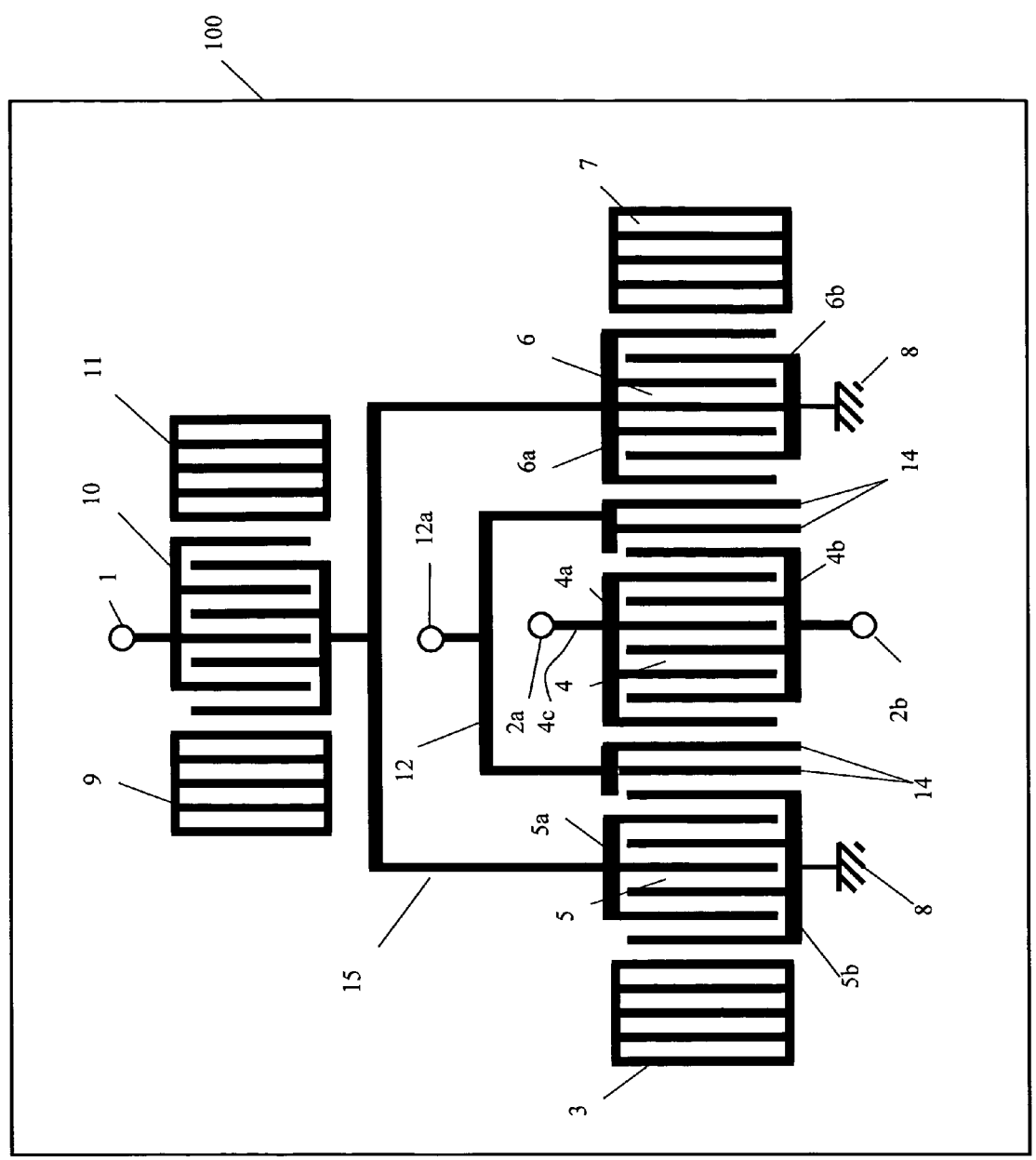
FIG. 10 is a plan view of the SAW filter having a pad for earth potential provided on the piezoelectric substrate in accordance with the second embodiment of the present invention.
Figure 11:
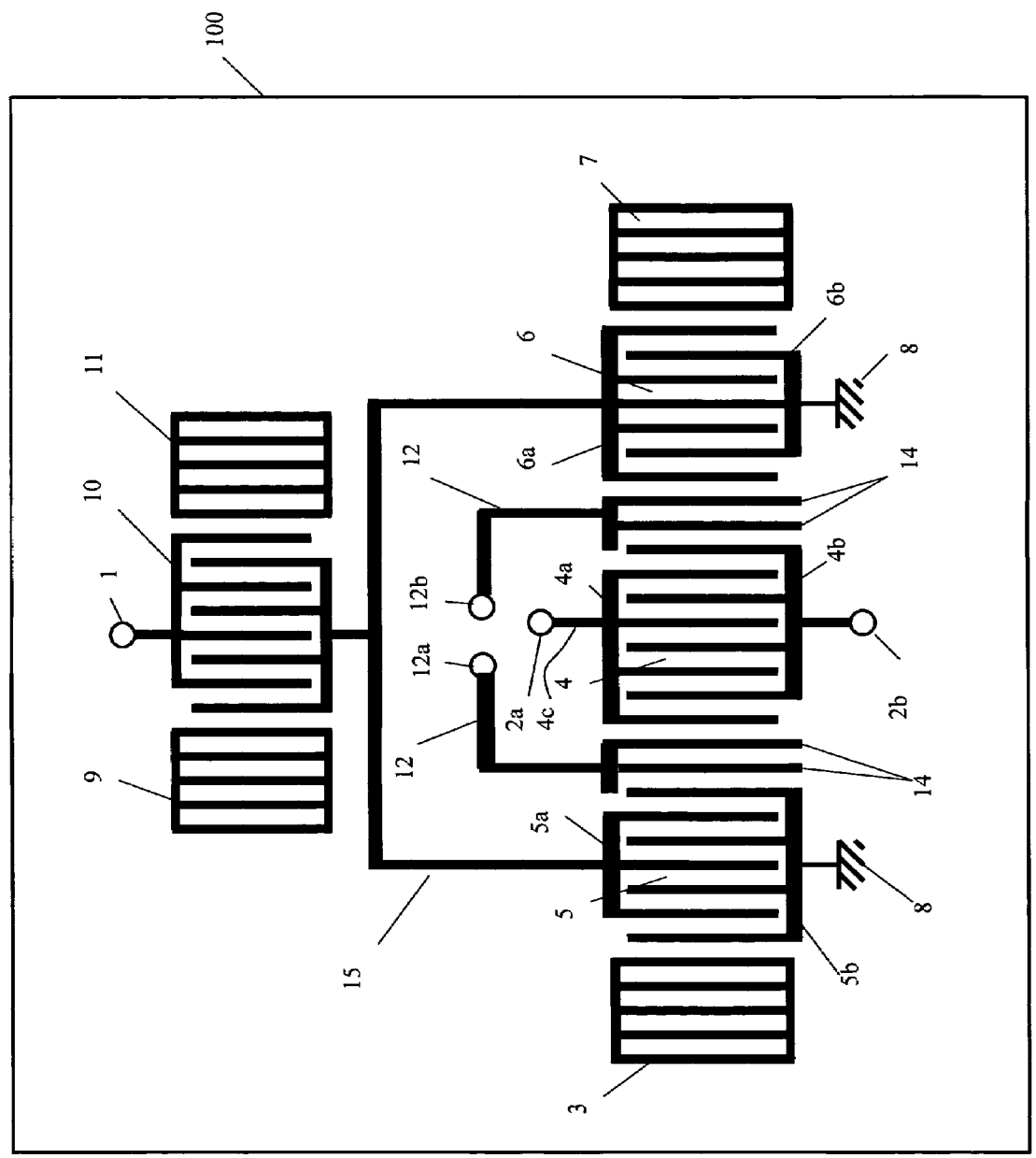
FIG. 11 is a plan view of the SAW filter having another pad for earth potential provided on the piezoelectric substrate in accordance with the second embodiment of the present invention.

It goes without saying that the pads 12a and 12b shown in FIGS. 5 and 6 may be applied to FIG. 7. FIGS. 10 and 11 show such configurations.

Third Embodiment

Figure 12:
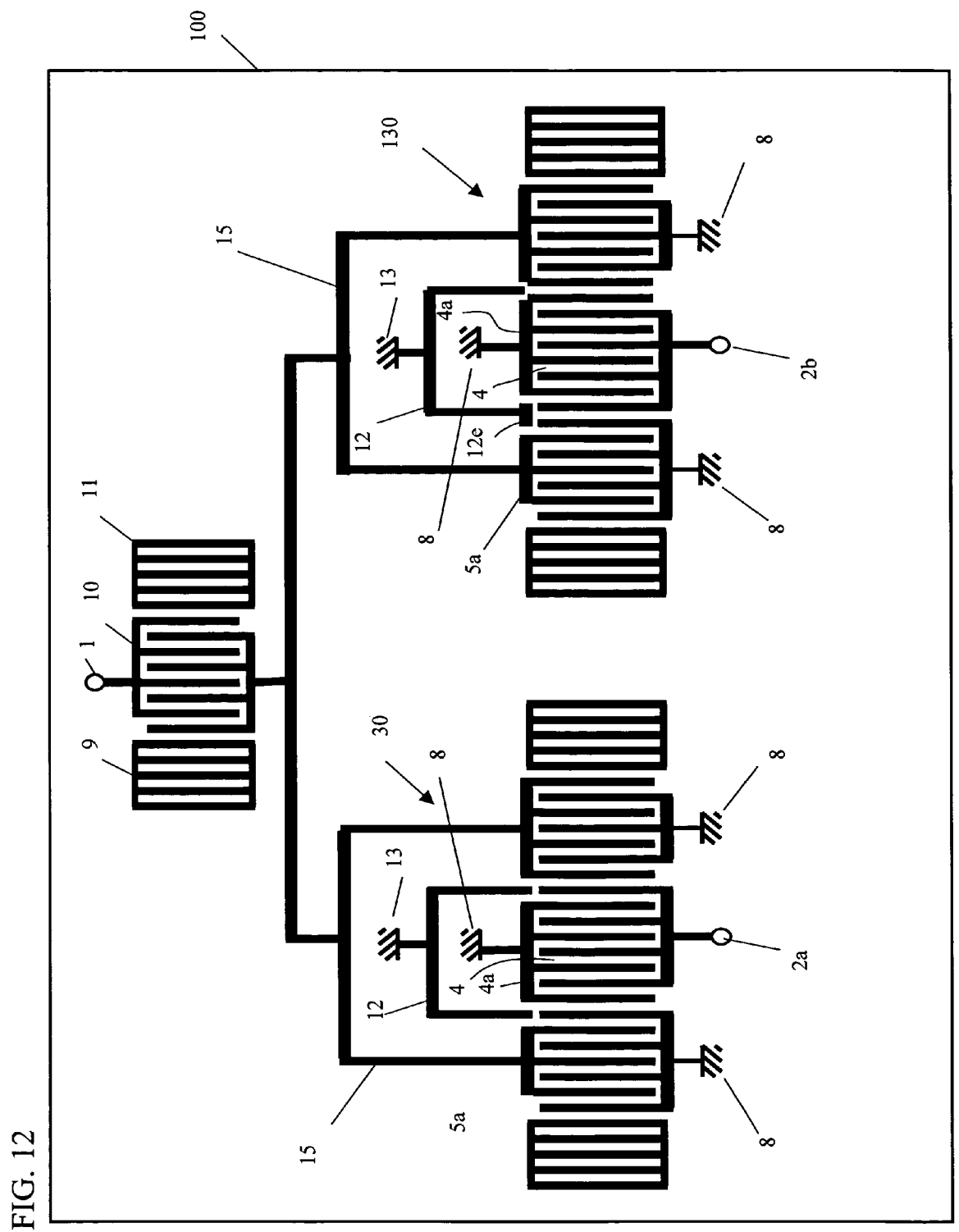
FIG. 12 is a plan view of a SAW filter in accordance with a third embodiment of the present invention.

FIG. 12 is a plan view of a SAW filter in accordance with a third embodiment of the present invention. Two filters 30 and 130 are connected in parallel. The balanced operation is performed between the terminal 2a of the filter 30 and the terminal 2b of the filter 130. The filter 30 has the same components and configuration as those of the SAW filter shown in FIG. 1, and includes the shield electrode 12. The filters 30 and 130 have mutually different electrode finger patterns so as to operate in opposite phases. Specifically, the IDT 4 of the filter 30 has a different electrode finger pattern from that of the filter 130. The filter 130 also includes the shield electrode 12 as shown. The distance between bus bars 4a and 5a of the filter 130 is longer than its corresponding distance of the filter 30. This results from the electrode finger pattern of the filter 130. An edge 12e of the shield electrode 12 of the filter 130 is widely arranged. Thus, an excellent symmetry of the balanced operation is obtainable by the function of the shield electrode 12.

Two earth potentials 13 in FIG. 12 are in circuitries different from those of ground potentials 8. The two earth potentials 13 are connected together on a package on which the piezoelectric substrate 100 is mounted, and are connected to one external connection terminal for the earth potential.

Fourth Embodiment

Figure 13:
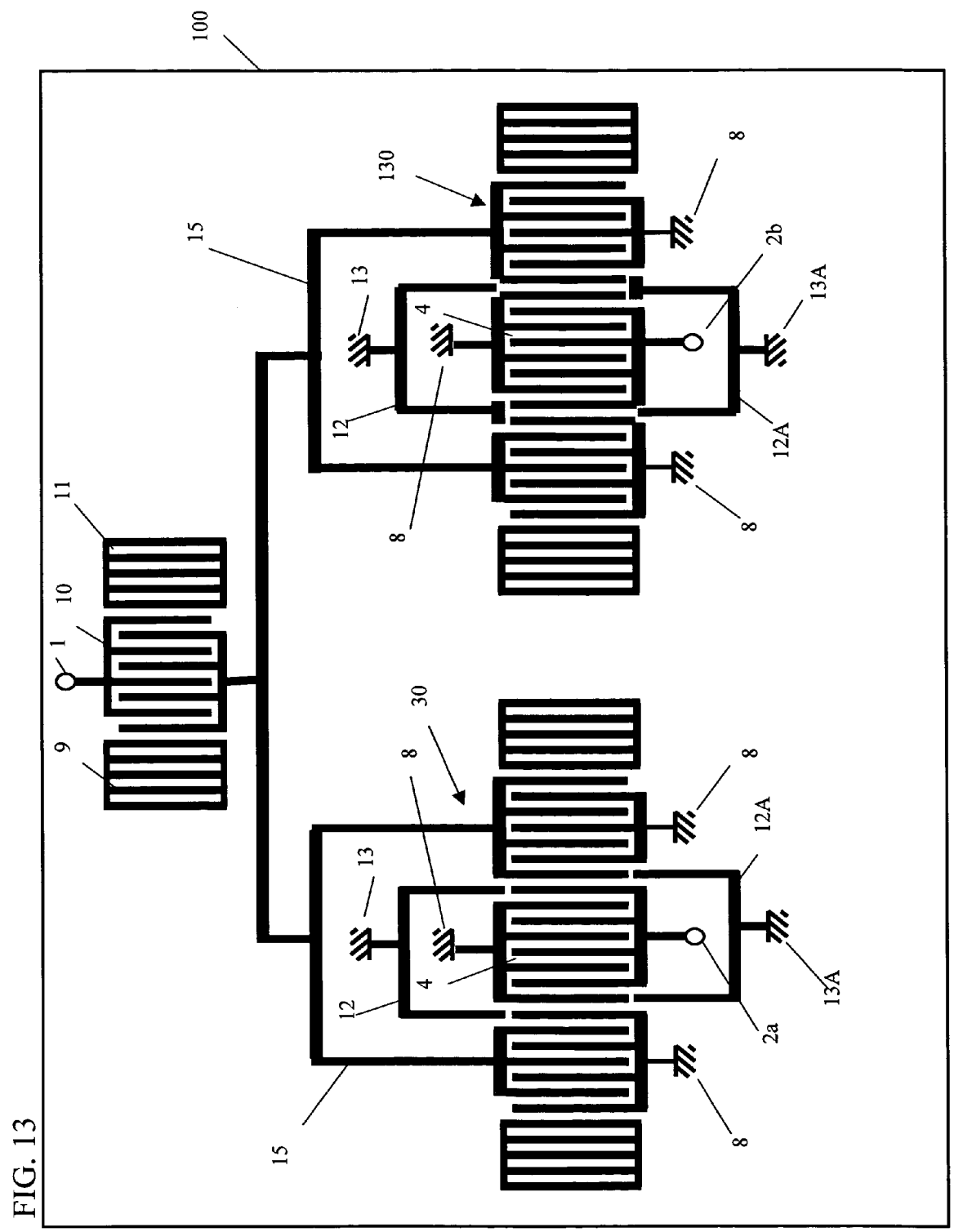
FIG. 13 is a plan view of a SAW filter in accordance with a fourth embodiment of the present invention.

FIG. 13 is a plan view of a SAW filter in accordance with a fourth embodiment of the present invention. In accordance with the fourth embodiment of the present invention, a shield electrode 12A is added to the third embodiment of the present invention. Each of filters 30 and 130 includes the shield electrode 12A on the opposite side of shield electrodes 12 in order to establish shielding between IDTs 4 and 5 and between IDTs 4 and 6. The shield electrode 12A is connected to the earth potential 13A. It is thus possible to further improve the symmetry of the balanced operation, by providing the shield electrodes 12 and 12A on both sides of the IDTs 4 through 6 that are arranged in line. The earth potentials 13A are separately arranged and are respectively connected to the two shield electrodes 12A. However, the earth potentials 13A may be connected together on the piezoelectric substrate 100 and then may be connected to the earth potential.

In addition to FIG. 13, in FIGS. 1, 5, and 6, the shield electrodes 12 and 12A may be provided on both sides of the IDTs 4 through 6, which are arranged in line.

Fifth Embodiment

Figure 14:
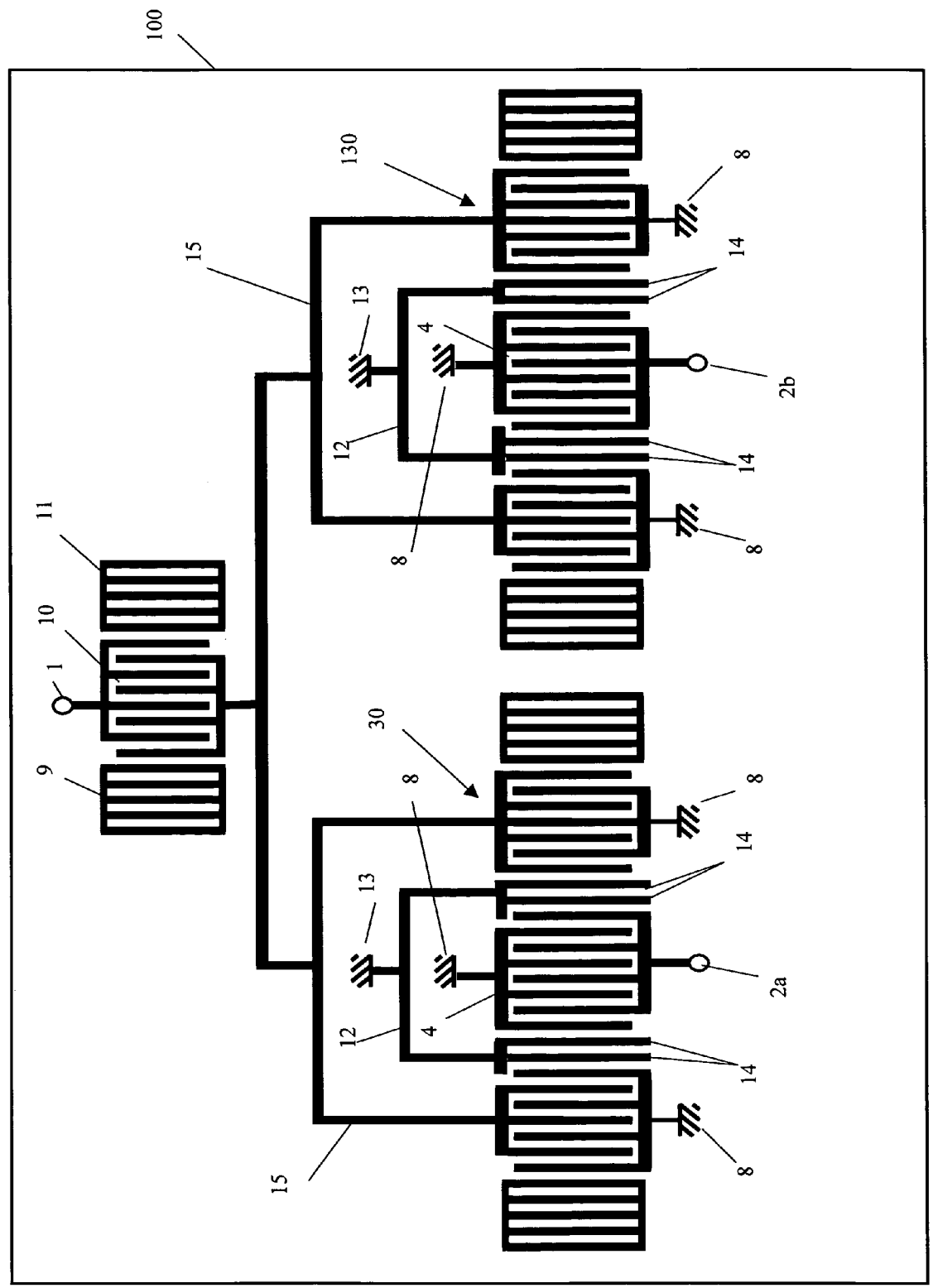
FIG. 14 is a plan view of a SAW filter in accordance with a fifth embodiment of the present invention.

FIG. 14 is a plan view of a SAW filter in accordance with a fifth embodiment of the present invention. The fifth embodiment of the present invention includes the two shield electrodes 12 in FIG. 12, and also includes the same type of comb-like electrodes as those in FIG. 7.

Sixth Embodiment

Figure 15:
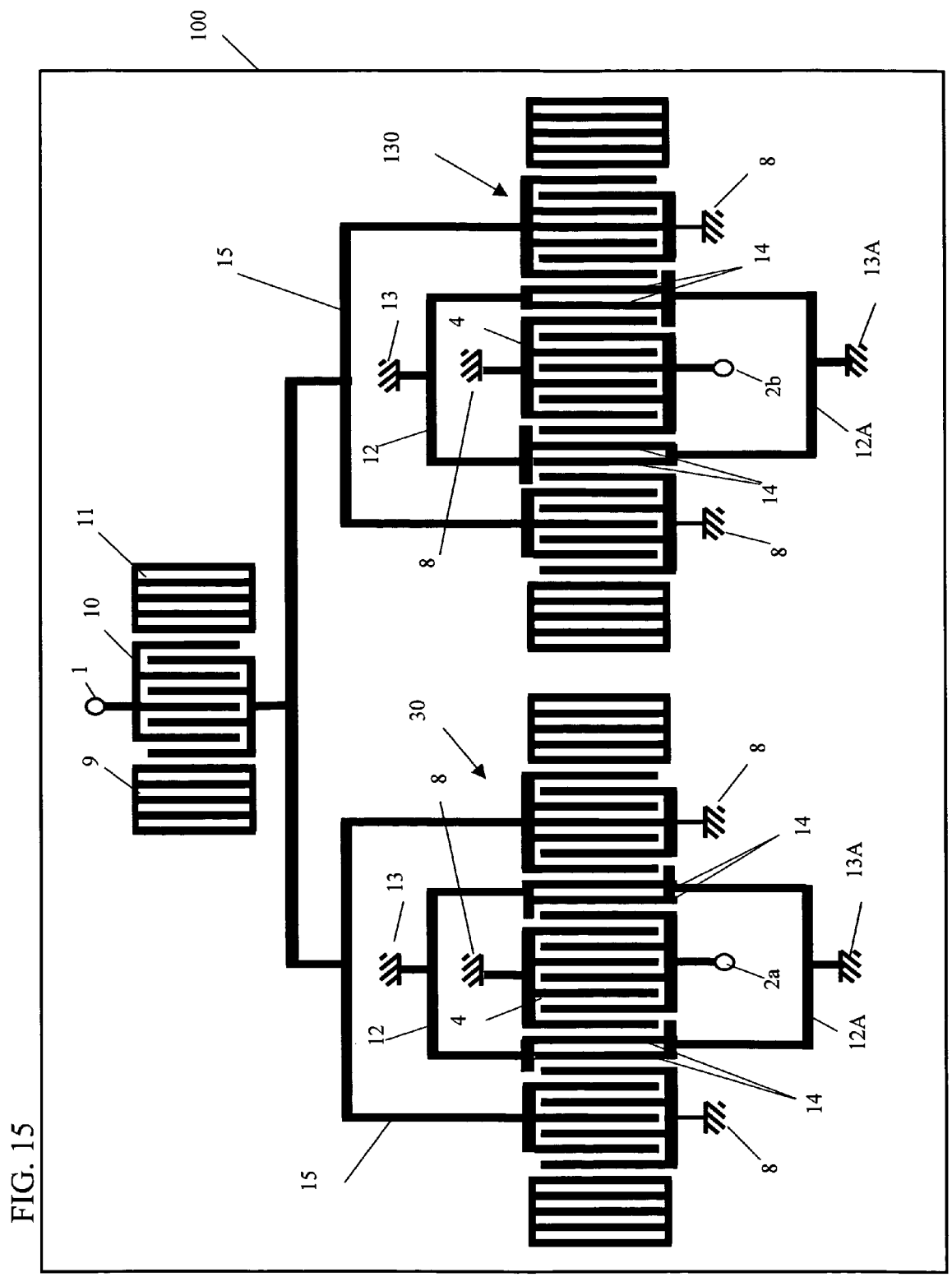
FIG. 15 is a plan view of a SAW filter in accordance with a sixth embodiment of the present invention.

FIG. 15 is a plan view of a SAW filter in accordance with a sixth embodiment of the present invention. The sixth embodiment of the present invention includes the four shield electrodes 12 in FIG. 13, and also includes the same type of comb-like electrodes as those in FIG. 7. Adjacent electrode fingers of the shield electrode 12 are all connected together. Thus, the shield electrodes 12 and 12A of the filter 30 are formed in a loop so as to surround the IDT 4. Similarly, the shield electrodes 12 and 12A of the filter 130 are arranged in a loop so as to surround another IDT 4. Earth potentials 13A are respectively connected to the shield electrode 12A as shown in FIG. 15, but may be connected together on the piezoelectric substrate 100, and then may be connected to the earth potential.

Seventh Embodiment

Figure 16:
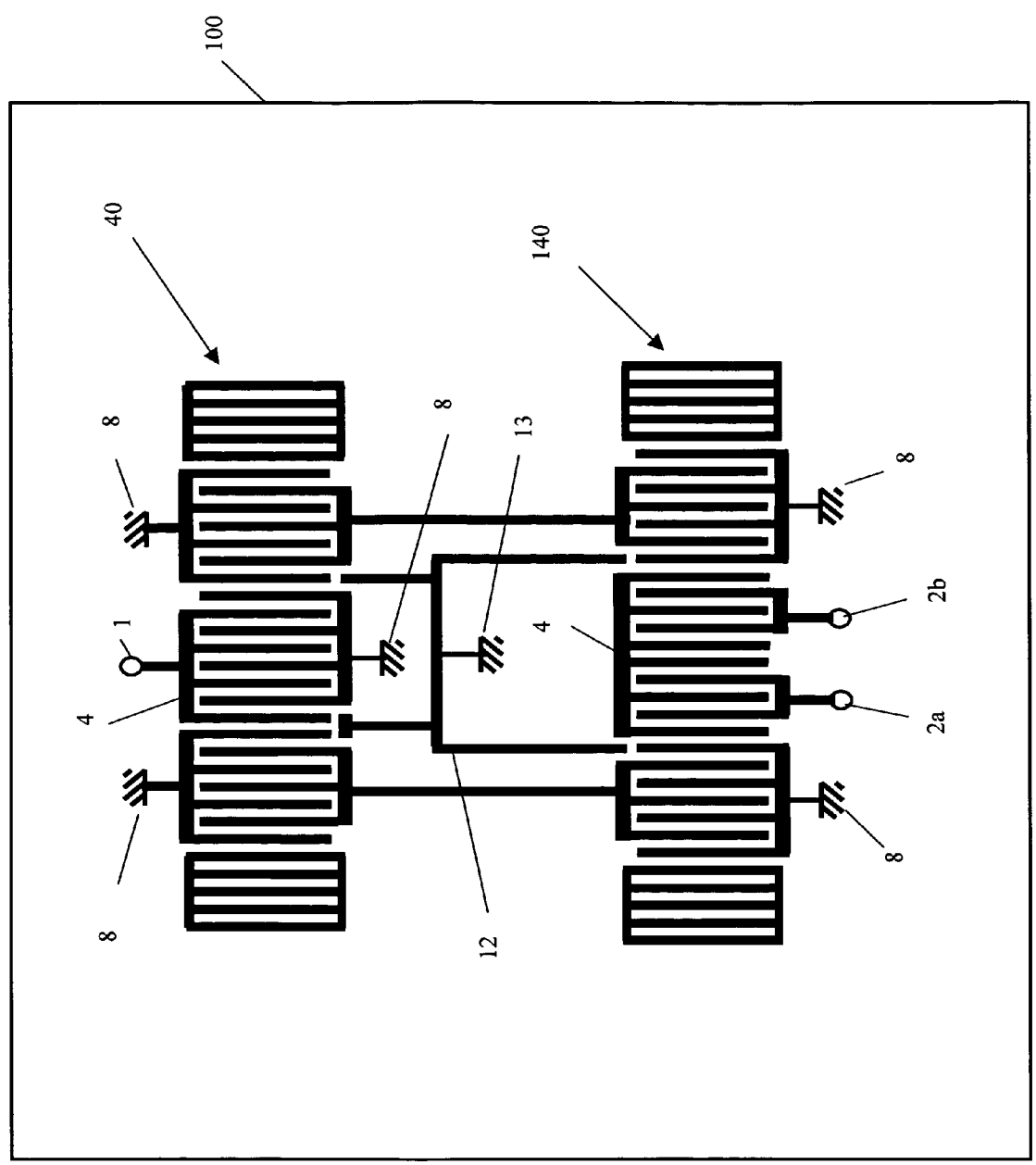
FIG. 16 is a plan view of a SAW filter in accordance with a seventh embodiment of the present invention.

FIG. 16 is a plan view of a SAW filter in accordance with a seventh embodiment of the present invention. This filter includes two filters 40 and 140. In the case where the signal terminal 1 is used as an input terminal, the filter 40 outputs balanced signals to the filter 140, which outputs the balanced signals through balanced signal terminals 2a and 2b. The IDT 4 of the filter 140 includes two IDTs, which are connected together to one of bus bars and are adjacently arranged in a propagation direction. The shield electrode 12 is provided to be connected by the filters 40 and 140. Edges of the shield electrode 12 are arranged between adjacent bus bars. The shield electrode 12 is connected to the earth potential in a circuitry, which is different from that of the ground potential 8.

Eighth Embodiment

Figure 17:
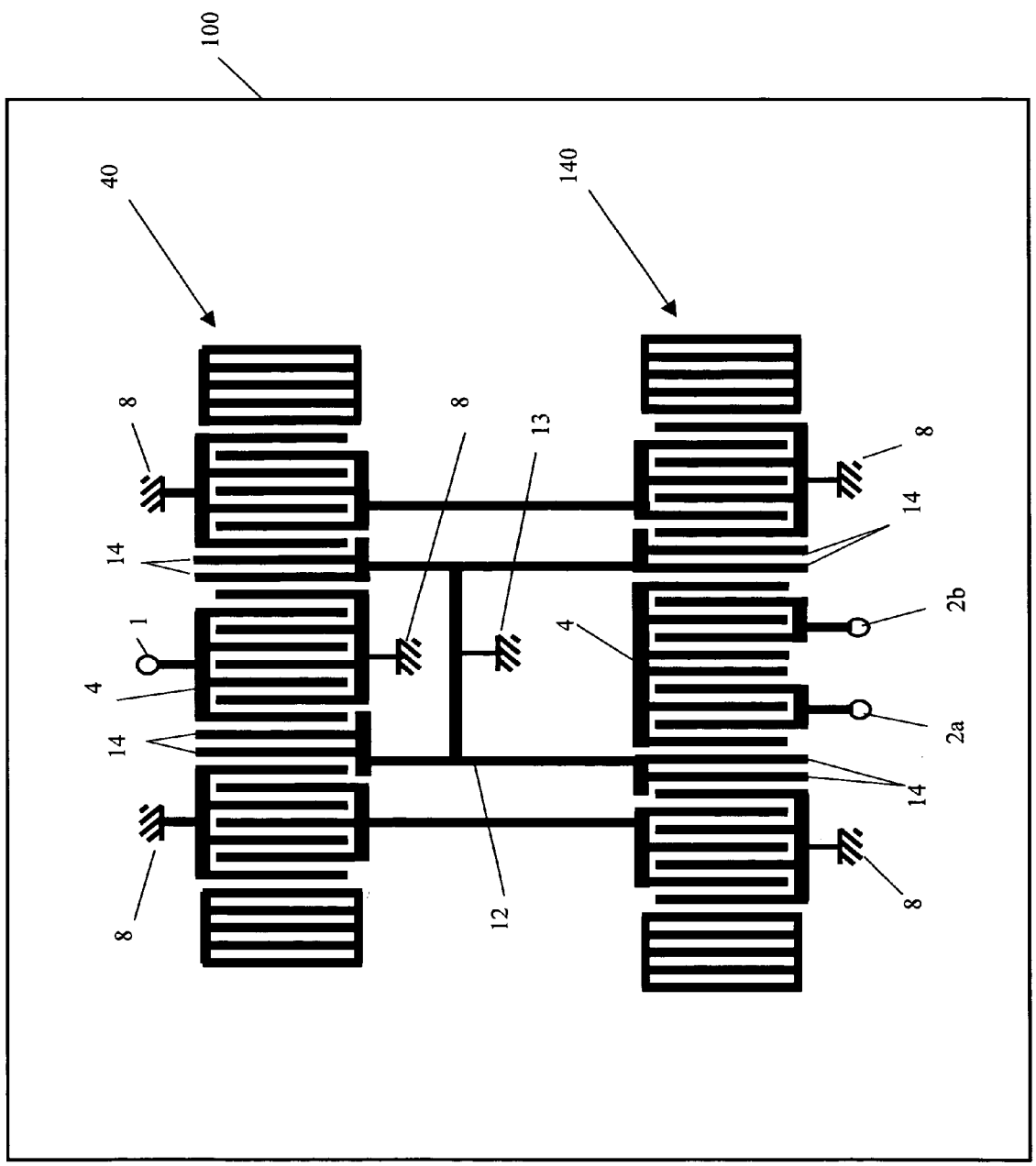
FIG. 17 is a plan view of a SAW filter in accordance with an eighth embodiment of the present invention.

FIG. 17 is a plan view of a SAW filter in accordance with an eighth embodiment of the present invention. The eighth embodiment of the present invention includes the shield electrodes 12 in accordance with the seventh embodiment of the present invention as shown in FIG. 16, and also includes the same type of comb-like electrodes as those in FIG. 7.

Ninth Embodiment

Figure 18:
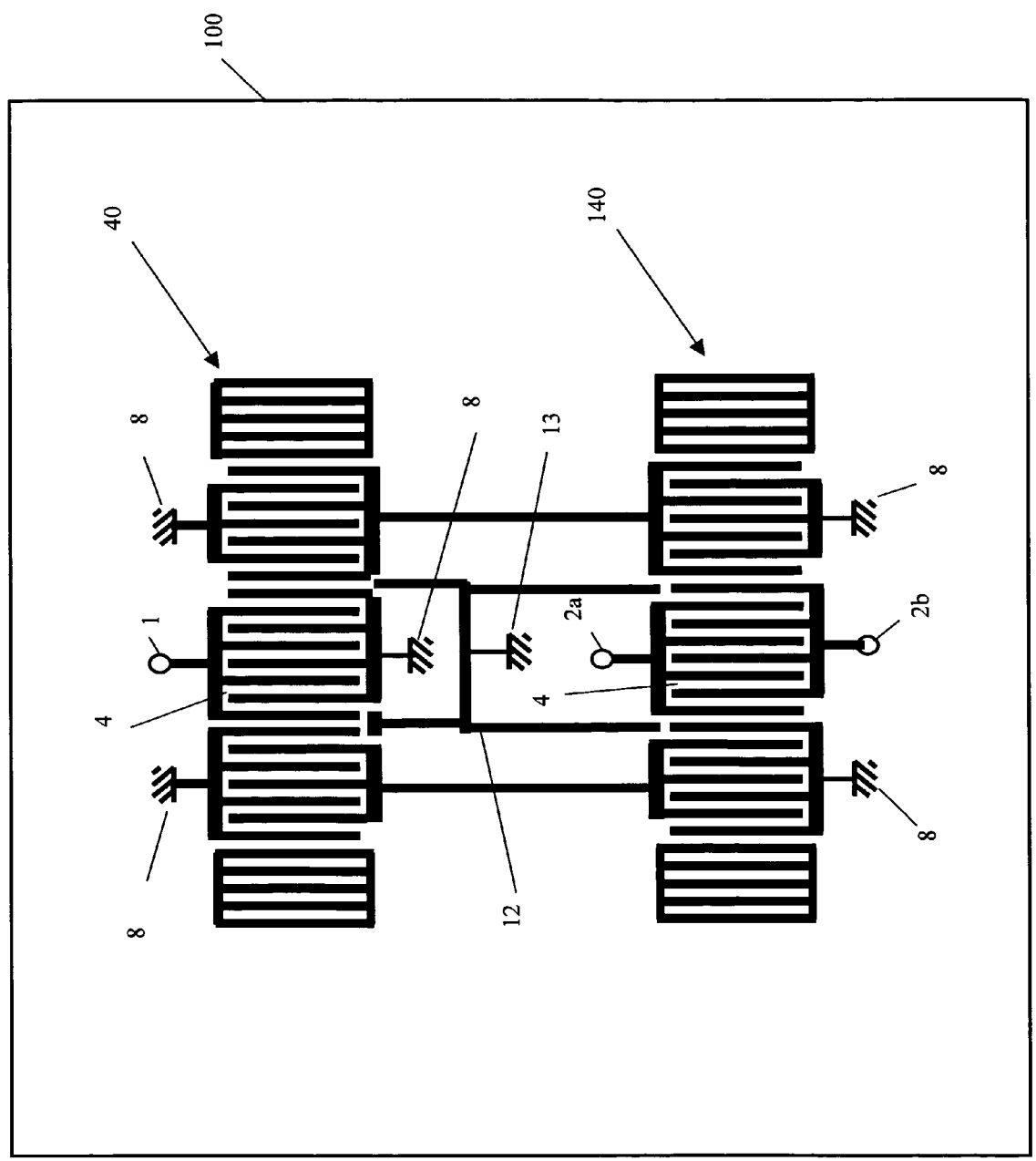
FIG. 18 is a plan view of a SAW filter in accordance with a ninth embodiment of the present invention.

FIG. 18 is a plan view of a SAW filter in accordance with a ninth embodiment of the present invention. The ninth embodiment of the present invention is a modified example of the seventh embodiment of the present invention as shown in FIG. 16. The ninth embodiment of the present invention includes an IDT 4, which has an electrode pattern different from that of the IDT 4 employed in the seventh embodiment of the present invention. The IDT 4 used in the ninth embodiment includes a pair of comb-like electrodes to which balanced signal terminals 2a and 2b are respectively connected. The shield electrode 12 has the same configuration as that in FIG. 7.

Tenth Embodiment

Figure 19:
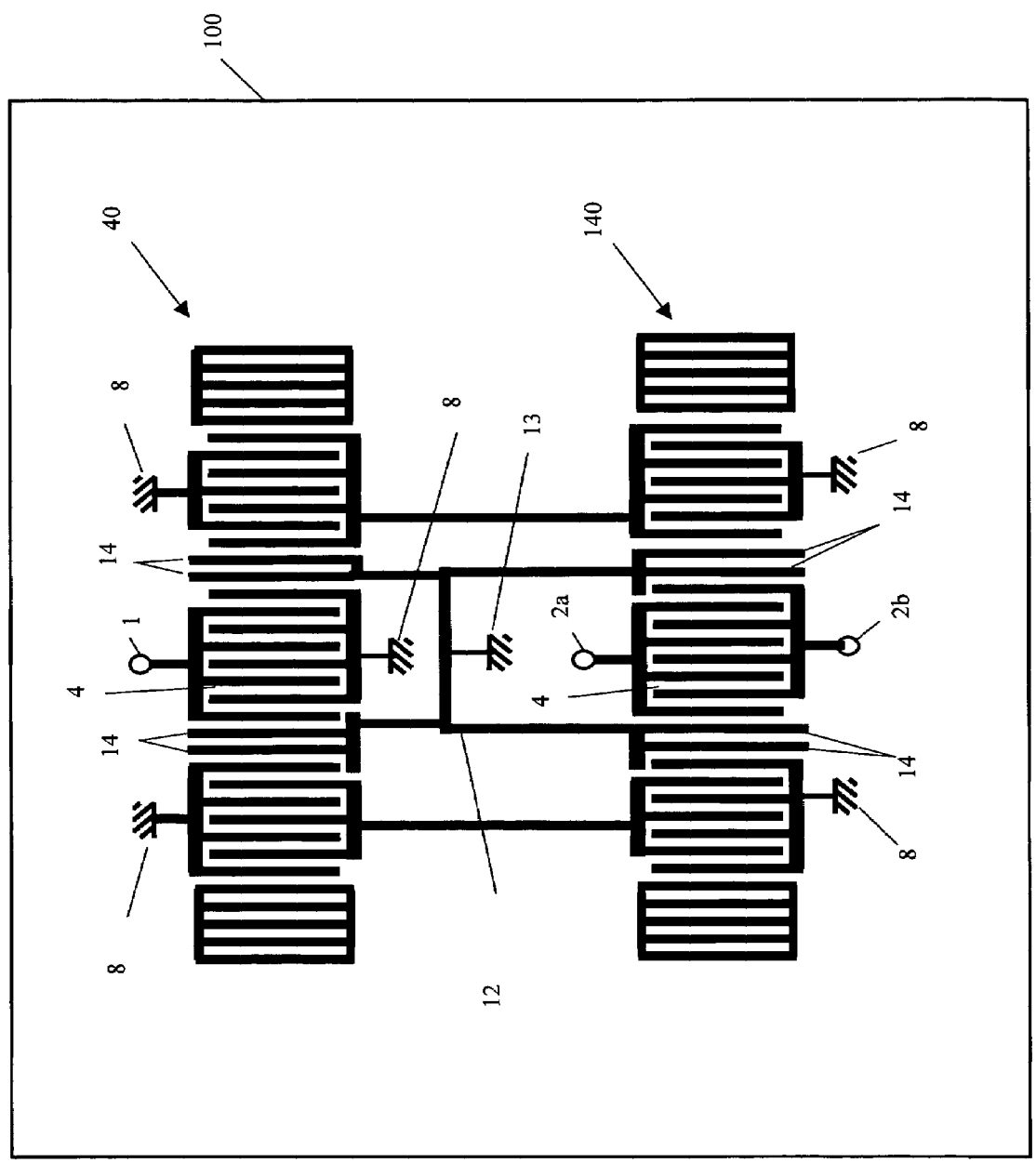
FIG. 19 is a plan view of a SAW filter in accordance with a tenth embodiment of the present invention.

FIG. 19 is a plan view of a SAW filter in accordance with a tenth embodiment of the present invention. This embodiment includes the shield electrodes 12 employed in the seventh embodiment of as shown in FIG. 18, and also includes the same type of comb-like electrodes as those in FIG. 7.

The first through tenth embodiments of the present invention have been described so far. In the above-mentioned embodiments, the shield electrode 12 may be made of the same material as those of the IDTs 4 through 6, for example, aluminum or aluminum-copper alloy, and may be made at the same time. In addition, the above-mentioned embodiments are employed together as necessary. For example, the pads, which are provided on the piezoelectric substrate 100 as shown in FIGS. 5 and 6, may be applied to the fifth through tenth embodiments. Further, with respect to other variations of the IDT configuration, the shield electrode may be arranged between the input IDT and the output IDT, or between the interconnection lines that connect the input and output IDTs.

Eleventh Embodiment

Figure 20:
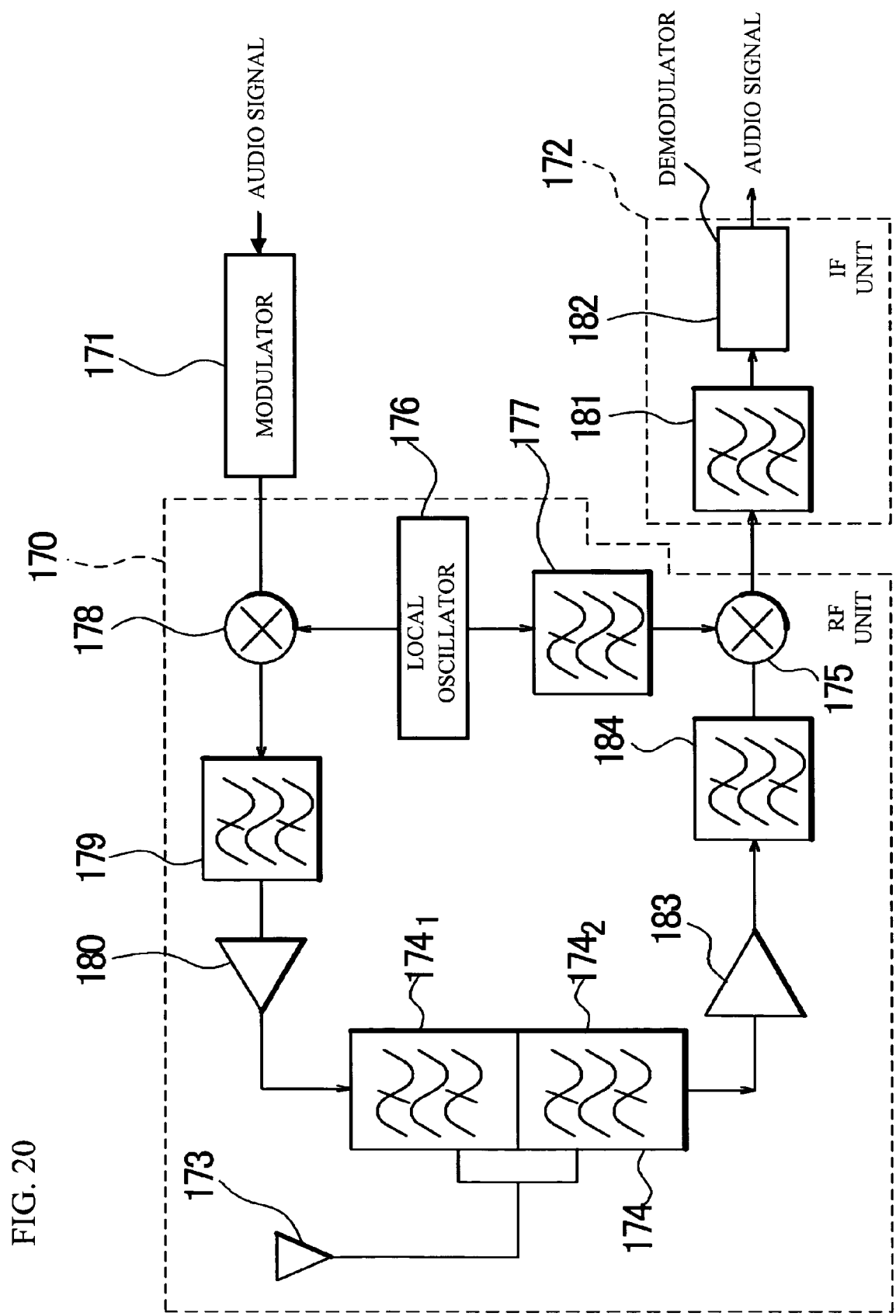
FIG. 20 is a plan view of a SAW filter in accordance with an eleventh embodiment of the present invention.

FIG. 20 is a block diagram illustrating a wireless device in accordance with an eleventh embodiment. This wireless device is equipped with some SAW filters of the present invention. FIG. 20 shows transmission and reception systems of the wireless device. In the case where the wireless device is a mobile telephone or the like, the transmission and reception systems in FIG. 20 are connected to a speech processing system or the like.

The wireless device includes an RF (Radio Frequency) unit 170, a modulator 171, and an IF (Intermediate Frequency) unit 172. The RF unit 170 includes an antenna 173, a separator 174, a low noise amplifier 183, an interstage filter 184, a mixer (multiplier) 175, a local oscillator 176, an interstage filter 177, a mixer (multiplier) 178, an interstage filter 179, and a power amplifier 180. An audio signal applied from the speech processing system is modulated on the modulator 171, and the frequency of the audio signal is converted or mixed on the mixer 178 of the RF unit 170 with the use of an oscillation signal generated by the local oscillator 176. An output from the mixer 178 passes through the interstage filter 179 and the power amplifier 180, and is given to the separator 174. The separator 174 includes a transmission filter $174_1$, a reception filter $174_2$, and a matching circuit (not shown). The separator 174 utilizes the SAW filter(s) of the present invention. A signal transmitted from the power amplifier 180 is fed to the antenna 173 through the separator 174.

The signal received from the antenna 173 passes through the reception filter $174_2$ of the separator 174, and is applied to the mixer 175 through the low noise amplifier 183 and the interstage filter 184. The mixer 175 receives an oscillating frequency generated by the local oscillator 176 by way of the interstage filter 177, converts the frequency of the received signal, and applies the signal to the IF unit 172. The IF unit 172 receives the signal by way of the IF filter 181, demodulates with a demodulator 182, and outputs the demodulated audio signal to the speech processing system that is not shown.

The SAW filter of the present invention includes the above-mentioned separator 174 and the interstage filters 177, 179, and 184. The above-mentioned separator 174 includes the transmission filter $174_1$ and the reception filter $174_2$.

The SAW filter of the present invention is capable of decreasing malfunctions caused by noises in a high-frequency circuit of the wireless device on which an integrated circuit (IC) having an input and output of the balanced operation.

The present invention is not limited to the above-mentioned first through eleventh embodiments, and other embodiments, variations and modifications may be made without departing from the scope of the present invention.

The present invention is based on Japanese Patent Application No. 2003-392832 filed on Nov. 21, 2003, the entire disclosure of which is hereby incorporated by reference.

What is claimed is:

1. A surface acoustic wave (SAW) filter comprising:
   a piezoelectric substrate;
   a first interdigital transducer (IDT) for input and a second IDT for output that are provided on the piezoelectric substrate, the first IDT and the second IDT being arranged in a propagation direction; and a shield electrode arranged between the first IDT and the second IDT and/or between interconnection lines connected to the first IDT and the second IDT, at least one of the first IDT and the second IDT being of a longitudinal coupling multi-mode type having a balanced operation, wherein the shield electrode has electrode fingers that are interposed between the first IDT and the second IDT.

2. A surface acoustic wave (SAW) filter comprising:

a piezoelectric substrate;

a first interdigital transducer (IDT) for input and a second IDT for output that are provided on the piezoelectric substrate, the first IDT and the second IDT being arranged in a propagation direction; and a shield electrode arranged between the first IDT and the second IDT and/or between interconnection lines connected to the first IDT and the second IDT, at least one of the first IDT and the second IDT being of a longitudinal coupling multi-mode type having a balanced operation, wherein the shield electrode has multiple fingers that are interposed between the first IDT and the second IDT and are connected together.

3. A surface acoustic wave (SAW) filter comprising:

a piezoelectric substrate;

a first interdigital transducer (IDT) for input and a second IDT for output that are provided on the piezoelectric substrate, the first IDT and the second IDT being arranged in a propagation direction; and a shield electrode arranged between the first IDT and the second IDT and/or between interconnection lines connected to the first IDT and the second IDT, the shield electrode having end portions that are interposed between bus bars of the first and second IDTs and extend along entire widths of the bus bars, wherein at least one of the first IDT and the second IDT being of a longitudinal coupling multi-mode type have a balanced operation, and wherein the shield electrode is isolated, on the piezoelectric substrate, from the first IDT and the second IDT.

4. A surface acoustic wave (SAW) filter comprising:

a piezoelectric substrate;

a first interdigital transducer (IDT) for input and a second IDT for output that are provided on the piezoelectric substrate, the first IDT and the second IDT being arranged in a propagation direction; and a shield electrode arranged between the first IDT and the second IDT and/or between interconnection lines connected to the first IDT and the second IDT, at least one of the first IDT and the second IDT being of a longitudinal coupling multi-mode type having a balanced operation, wherein the shield electrode is connected to a potential different from a ground potential that is connected to one of the first IDT and the second IDT.

5. A surface acoustic wave (SAW) filter comprising:

a piezoelectric substrate;

a first interdigital transducer (IDT) for input and a second IDT for output that are provided on the piezoelectric substrate, the first IDT and the second IDT being arranged in a propagation direction; and a shield electrode arranged between the first IDT and the second IDT and/or between interconnection lines connected to the first IDT and the second IDT, the shield electrode having end portions that are interposed between bus bars of the first and second IDTs and extend along entire widths of the bus bars, wherein at least one of the first IDT and the second IDT being of a longitudinal coupling multi-mode type have a balanced operation, and wherein the shield electrode is connected to an earth potential that is not connected, on the piezoelectric substrate, to a ground potential connected to one of the first IDT and the second IDT.

* * * * *